US008855325B2

(12) United States Patent
Vogel et al.

(10) Patent No.: US 8,855,325 B2
(45) Date of Patent: Oct. 7, 2014

(54) METHOD FOR SYNTHESIZING AN ENGINE NOISE AND DEVICE FOR CARRYING OUT THE METHOD

(75) Inventors: Friedemann Vogel, Ingolstadt (DE); Lars Hinrichsen, Ingolstadt (DE)

(73) Assignee: Audi AG, Ingolstadt (DE)

( * ) Notice: Subject to any disclaimer, the term of this patent is extended or adjusted under 35 U.S.C. 154(b) by 281 days.

(21) Appl. No.: 13/511,592

(22) PCT Filed: Nov. 25, 2010

(86) PCT No.: PCT/EP2010/007147
§ 371 (c)(1), (2), (4) Date: May 23, 2012

(87) PCT Pub. No.: WO2011/063956
PCT Pub. Date: Jun. 3, 2011

(65) Prior Publication Data
US 2012/0275612 A1 Nov. 1, 2012

(30) Foreign Application Priority Data
Nov. 25, 2009 (DE) ........................ 10 2009 055 777

(51) Int. Cl.
*H03G 3/00* (2006.01)
*G10K 15/02* (2006.01)

(52) U.S. Cl.
CPC ..................................... *G10K 15/02* (2013.01)
USPC ............................................................ 381/61

(58) Field of Classification Search
CPC ............ G10H 1/06; G10H 1/16; G10K 15/02
USPC ............................................................ 381/61
See application file for complete search history.

(56) References Cited

U.S. PATENT DOCUMENTS

2005/1113168 5/2005 Maeda
2006/1177797 8/2006 Costello et al.

FOREIGN PATENT DOCUMENTS

| | | | |
|---|---|---|---|
| DE | 690 23 133 | T3 | 6/2000 |
| DE | 10 2005 012 463 | B3 | 6/2006 |
| DE | 10 2007 055 477 | A1 | 5/2009 |
| JP | 1993-080790 | A | 4/1993 |
| JP | 2000-010576 | A | 4/1993 |
| JP | 1998-083187 | A | 3/1998 |
| JP | 2009-063968 | A | 3/2000 |
| JP | 2005-134749 | A | 5/2005 |

*Primary Examiner* — Sonia Gay
(74) *Attorney, Agent, or Firm* — Henry M. Feiereisen LLC

(57) ABSTRACT

The invention relates to a method for synthesizing an engine noise, in particular of an internal combustion engine, wherein the engine noise is generated by at least one electromechanical transducer, in particular an actuator or a loudspeaker, by means of a signal value corresponding to an electrical transducer excitation signal. According to the invention, at least one signal sample (A) having function values (9) is stored in a data memory (3) as a digital data series, such that at signal sample support points (8) following each other in succession at intervals (7), function values (9) are retrievably stored, and such that in accordance with detected and/or pre-definable guide variables as operating parameters of the engine, optionally of a vehicle driven by the engine, function values (9) are retrieved from the data series adapted to the rotational speed and are allocated, level-matched, to signal values in a computing unit (1), and directly or indirectly supplied to the at least one transducer as transducer excitation signals. A device for carrying out the method is also claimed.

17 Claims, 3 Drawing Sheets

METHOD FOR SYNTHESIZING AN ENGINE NOISE AND DEVICE FOR CARRYING OUT THE METHOD

CROSS-REFERENCES TO RELATED APPLICATIONS

This application is the U.S. National Stage of International Application No. PCT/EP2010/007147, filed Nov. 25, 2010, which designated the United States and has been published as International Publication No. WO 2011/063956 and which claims the priority of German Patent Application, Serial No. 10 2009 055 777.6, filed Nov. 25, 2009, pursuant to 35 U.S.C. 119(a)-(d).

BACKGROUND OF THE INVENTION

The invention relates to a method for synthesizing an engine noise, in particular of an internal combustion engine, as well as to a device for carrying out the method.

Several methods for generating synthetic engine noises are generally known to supplement in particular an existing engine noise of a motor vehicle so as to produce in combination a pleasing engine sound. For that purpose, electric transducer signals are generated as signal values which are fed to at least one installed electromechanical transducer, in particular an actuator or loudspeaker.

In such a method (DE 690 23 133 T3), an existing engine noise is supplemented by a produced additional sound to provide a pleasing engine sound in the interior. The state of the engine and its actual engine noise is determined by a microphone and/or a vibration sensor disposed at the engine and via a load signal. Vehicle operating noises, e.g. a sport sound, commensurate with the determined state of the engine are read out from a sound memory and made audible in the passenger compartment in addition to the actual engine noise, using loudspeakers or electrodynamic actuators. The sensor signals required for reading out the sound memory are complex and cannot be readily used to address the sound memory.

Another method for supplementing an engine noise of a motor vehicle is known (DE 10 2005 012 463 B3), wherein level values, which each correspond to a defined engine rotation speed and whose associated vibrations having orders corresponding to a multiple of half the motor rotation speed, are stored in a data memory of a control unit in a characteristic diagram at speed interpolation points. At a particular motor rotation speed, lever values of several orders associated with the particular motor rotation speed are read out and transmitted to a processor of the control unit for computing as an actuator excitation signal a continuous time signal in form of a harmonic series. This method is based on a harmonic approach, wherein several harmonics are superimposed and wherein each harmonic component has a level curve as a function of the rotation speed. This type of superposition method necessitates high expenditures for creating a desired synthetic engine sound.

Another known method (10 2007 055 477 A1) addresses the formation of signal samples having certain segment lengths. Different segment sections are used within the segment lengths to allow intentional adjustment of sound features as control parameters in combination with the possible addition of well proportioned higher harmonic components. Accordingly, this is directed to a method for composing sound designs. For adaptation to an actual motor rotation speed, these created signal samples are repeated and compressed at higher rotation speeds or stretched at lower rotation speeds. This type of rotor speed adjustment is complex; moreover, the possibilities for producing different sounds with manageable data sets are limited.

It is therefore an object of the invention to propose a method for synthetically generating engine noises which allows generation of a variety of different engine sounds with greater clarity from a minimum of data.

SUMMARY OF THE INVENTION

This object is attained by storing in a data memory at least one signal sample with function values as digital data series, such that function values are stored for retrieval at consecutive, incrementally arranged signal sample interpolation points. Function values are retrieved from the data series commensurate with the rotation speed and computed in a computing unit into signal values commensurate with the level depending on measured and/or predefined reference variables as operating parameters of the engine and, optionally, of the vehicle driven by the engine, and then directly or indirectly transmitted in amplified form to the at least one transducer as transducer excitation signals.

Advantageously, a variety of different sounds can be provided by adjusting the incremental width as a function of the rotation speed in conjunction with level adjustments associated with the reference variables, optionally by combining several signal samples, always using the same relatively small required data set stored in the data memory. Advantageously, suitable additional sounds for different vehicles can be used by merely applying different controls, while employing the same data memories and same data. In addition, different additional engine noises may advantageously be generated for varying an engine sound of the same vehicle and added to the original engine noise.

Preferably, a signal sample has a predetermined length and is associated with an engine rotation angle, whereby in particular a signal sample length may be associated with two engine revolutions of an internal combustion engine, corresponding to a crank angle of 720°. The signal sample is then read out repeatedly after passing this crankshaft angle of 720°.

The step sizes between the signal sample support points are associated with engine rotation angle steps, wherein the step sizes may be identical and may correspond to identical engine rotation angle steps. Alternatively, different fixed step sizes may be predetermined, or variable step sizes may be defined to be adjustable via predeterminable functions. With these variations in the step size, signal sampling can be optimized.

In general, the next function value is advantageously recalled from the data series of the signal sample based on a time-dependent value and at least one reference value. Preferably, the actual engine rotation speed is entered into the computing unit as a reference value for a corresponding actual adaptation of the recalled function values to the rotation speed, and a corresponding associated actual following engine rotation angle step is determined in conjunction with a clock cycle as a time-dependent quantity as the next rotation-speed-dependent step size for reading out the next function value stored at a signal sample support point.

The rotation speed is thus adapted by computing the respective next step size from the actual rotation speed, which eliminates the need, as required in the state-of-the-art, to compress or stretch signal chains according to the actual rotation speed in a complex process.

Advantageously, level curve values associated with reference values in one-to-one correspondence can be stored for recall in the data memory at level support points, wherein the support points of the level values are stored in relation to a rotation speed, load or speed, or in general as a percentage of a reference value. Read-out function values of a signal sample can then be adapted to signal values relating to the reference values as base level values for their actually desired level. In a simple adaptation, the function values as base level values can be multiplied with the level curve values. This provides substantial variability for generating engine sounds. The important operating parameters, in particular the rotation speed, the load and optionally in conjunction with a vehicle the gas pedal position, the speed and the driving time, are herein used as reference values for the level adaptation either individually or in combination, to produce a large variability for generating engine sounds.

According to another less complex measure for varying the generated engine sound, multipliers are applied to the determined rotation-speed-dependent step sizes and level curve values. For example, correspondingly larger or smaller step sizes can be generated for sampling function values of a signal sample by using multipliers. In this way, signal samples can be sampled at defined frequency ratios in relation to the engine rotation speed, and/or superimposed with defined frequency ratios.

Moreover, matrices can be stored which enable an association of stored signal samples, level curves of the reference values and optionally of multipliers for step sizes and/or levels associated with a respective sound of an engine noise, wherein initially a separation exists between the data pool and an indexed access, thus providing additional measures for variations and combinations. Additional matrix fields which may be activated by external addressing may be added for generating a variety of different sounds, wherein different sounds may be combined with different soundtracks, individually selected as well as combined. It should be emphasized again that only the approximately identical data set is retrieved even with such a large number of variations.

In addition, a device for carrying out at least one of the preceding methods is claimed.

BRIEF DESCRIPTION OF THE DRAWING

The invention will be described further with reference to a drawing.

It is shown in.

DETAILED DESCRIPTION OF PREFERRED EMBODIMENTS

Figure 1:
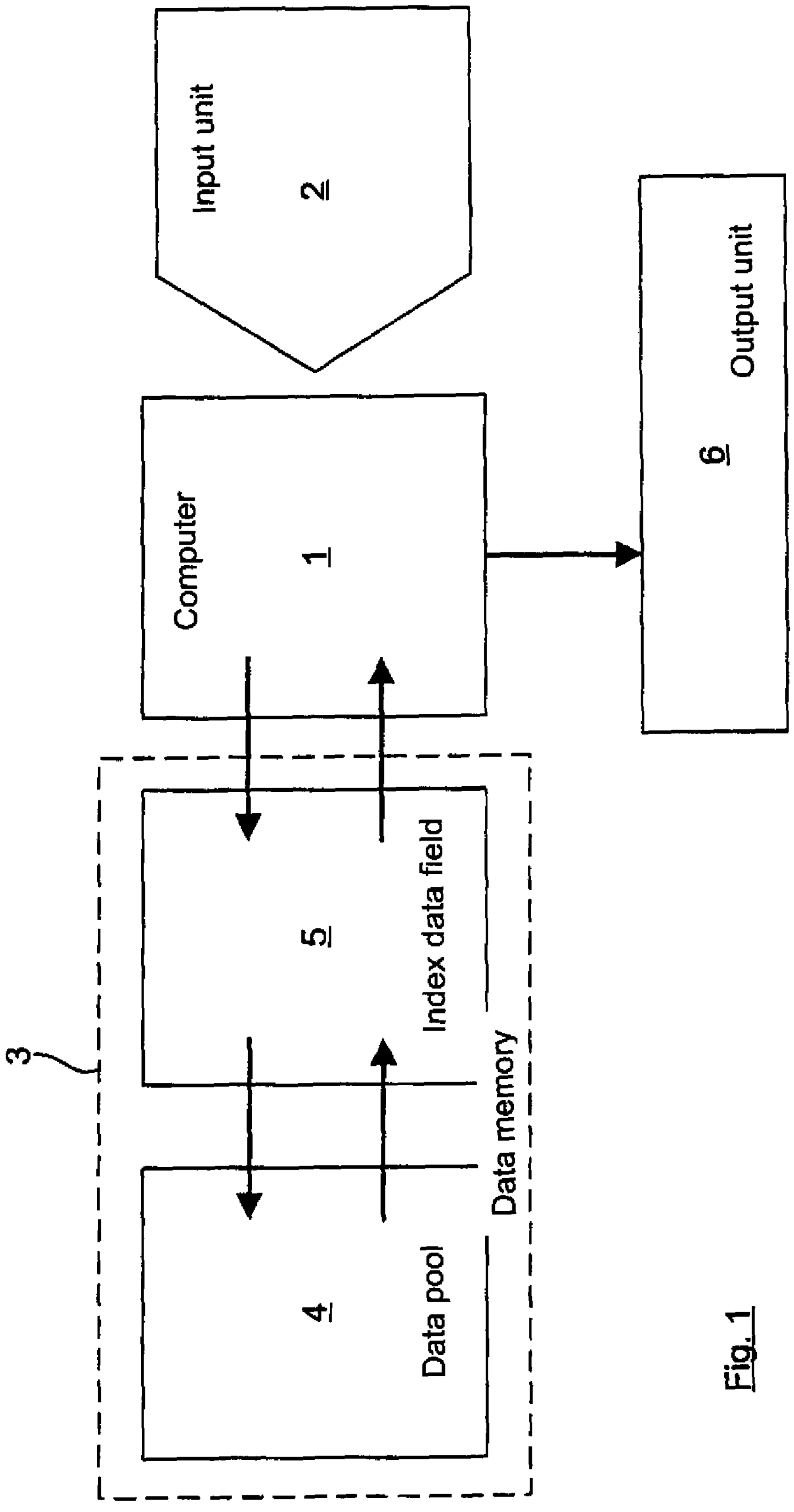
FIG. 1 a schematic block diagram of a device for transducer excitation signals for operating an actuator for generating engine noises.

FIG. 1 shows in form of a block diagram a computer 1, to which actually measured reference variables, in particular the operating parameters engine rotation speed, load and speed, as well as predeterminable quantities, such as a sound selection, etc. are supplied at an input unit 2. A data memory 3 is associated with the computer, wherein the data memory 3 has a data pool 4, in which signal samples, for example four signal samples A, B, C, D, as well as level curves, for example level curves F, G as a function of the rotation speed, level curves H, K as a function of the load, and a level curve M as a function of the speed are stored. Data combinations are defined in an index data field 5, whereby the addressing scheme of signal samples and level curves is also stored.

The computer 1 performs, by taking into account the actual rotation speed, a rotation speed adaptation for one or combined sounds in conjunction with a level adaptation over computed step sizes, and outputs with an output unit 6, optionally via an additional amplification unit, a transducer excitation signal, wherein the transducer excitation signal can be supplied to an actuator and/or to a loudspeaker for producing an engine noise.

Figure 2:
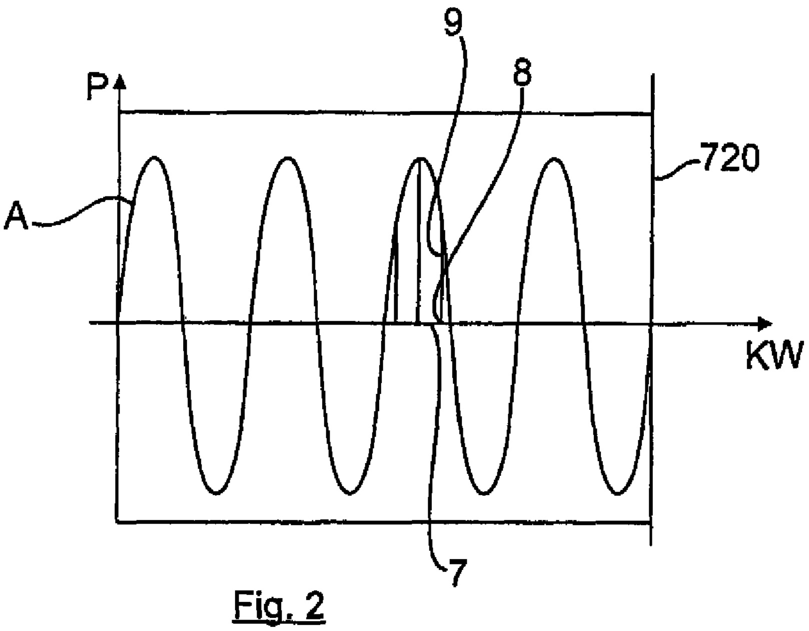
FIG. 2 a signal sample.

FIG. 2 shows schematically and in form of an example a signal sample A stored in the data pool 4 with an envelope curve in form of a sine function with four sinusoidal arcs, which correspond to a signal sample length for two engine revolutions of an internal combustion engine with a crank angle of 720°. However, the sine function is stored in the data pool not as a continuous curve, but as a digital data series with function values stored in step sizes 7 at signal sample support points 8. For sake of clarity, only some widely spaced support points 8 are shown. In a concrete example, engine rotation angle step sizes of about 2° to 5° are suitable. The additional signal samples B, C and D may be stored, for example, in the data pool 4 in a similar manner, but with different signal values.

Figure 3:
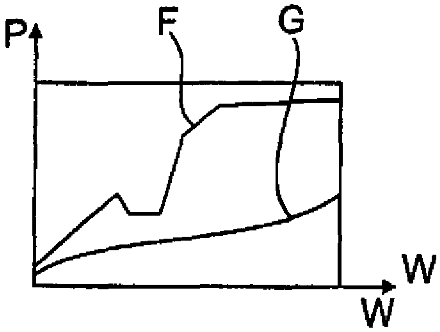
FIG. 3 level curves as a function of the rotation speed.
Figure 4:
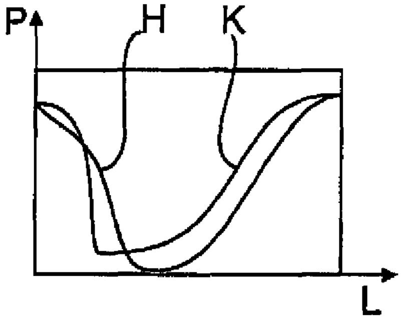
FIG. 4 level curves as a function of the load.
Figure 5:
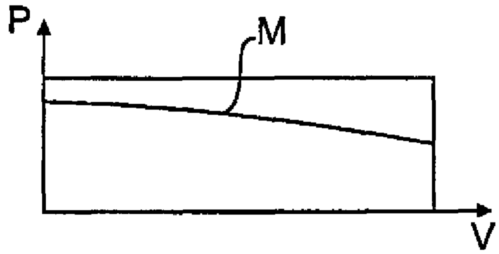
FIG. 5 a level curve as a function of the speed.

FIG. 3 shows the level curves F, G as a function of the rotation speed Ω (Omega), FIG. 4 shows the level curves H, K as a function of the load, and FIG. 5 shows the level curve M as a function of the speed V, which are also stored in the data pool.

Figure 6:
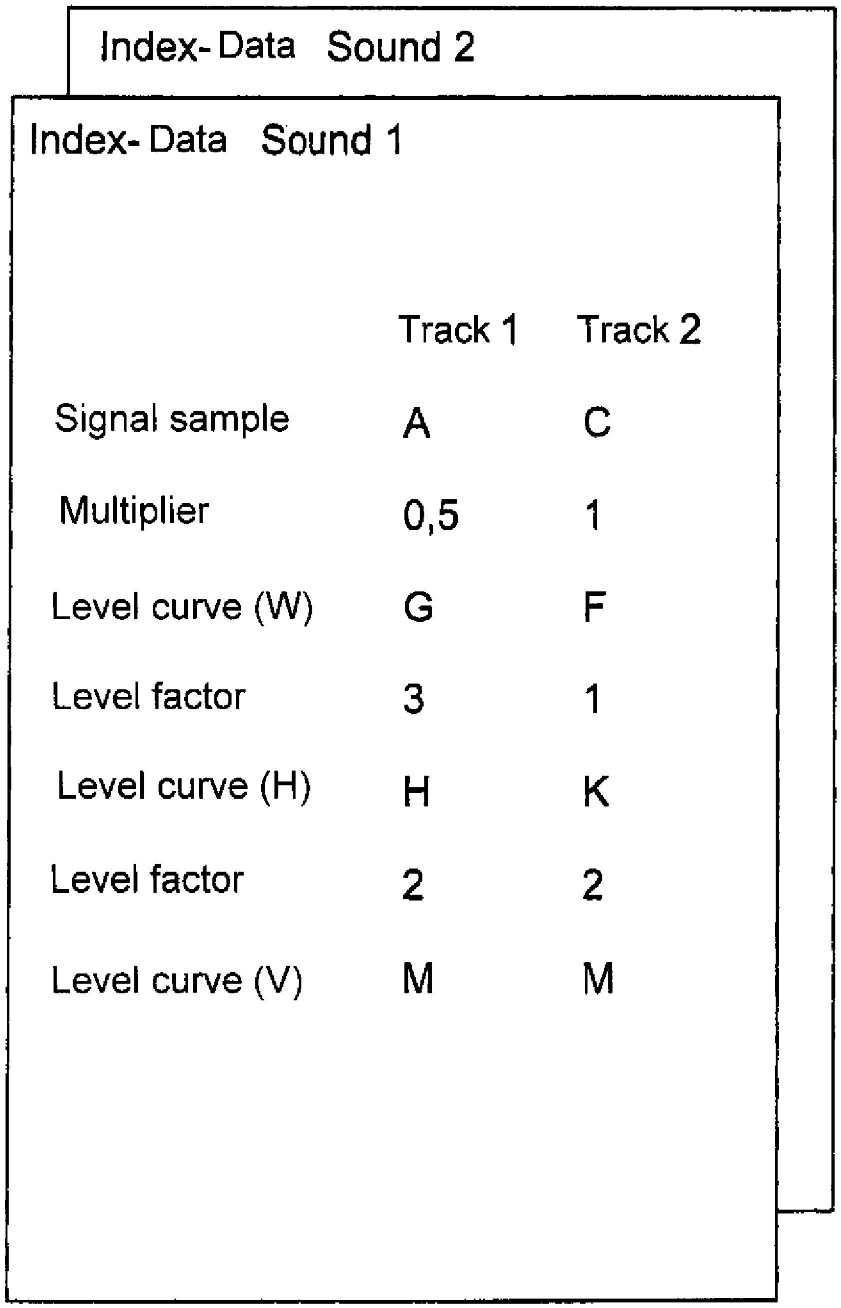
FIG. 6 indexed data for a sound 1.

FIG. 6 shows an example for creating an engine sound with the available means: the sound 1 is formed based on the illustrated Table, wherein the soundtracks are listed in the rows and the addresses in the columns. The indicated track 1 is formed from the signal sample A which is sampled with the determined step size times the multiplier 0.5. Associated therewith is the level curve G of a function of the rotation speed with a level factor as a multiplication factor. In addition, the level curve H as a function of the load is selected with an associated level factor 2, and the level curve M as a function of the speed lowers the levels commensurately. Similarly, the track 2 with an (unillustrated) signal sample C and the additionally listed weighting can be read out, whereby both tracks are superimposed.

Optionally, a sound 2 which is then optionally composed of five tracks can now be defined with the same data sets, whereby other or the same signal samples or level curves can be selected for this purpose.

What is claimed is:

1. A method for synthesizing an engine noise, in particular of an internal combustion engine, comprising the steps of:

retrievably storing in a data memory at least one signal sample having a predetermined length and being associated with an engine rotation angle, wherein the at least one signal sample is stored in form of function values, each function value representing a base level value, of a digital data series stored at signal sample support points which are sequentially arranged in step sizes, inputting into a computing unit an actual engine rotation speed as a reference value, multiplying in the computing unit the actual engine rotation speed with a clock cycle to compute a rotation-speed-adapted engine rotation angle step commensurate with a signal sample support point of the function value, recalling with the computing unit the function value of the at least one signal sample at the signal sample support point, producing from the recalled function value a rotation-speed-adapted level value which depends on measured or predefinable reference variables representing operating parameter of the engine or of a vehicle driven by the engine, computing a subsequent rotation-speed-adapted engine rotation angle step commensurate with a subsequent signal sample support point and recalling the function value at the subsequent signal sample support point to produce a subsequent rotation-speed-adapted level value, computing from the subsequent rotation-speed-adapted level value a signal value which is directly or indirectly transmitted to at least one electromechanical transducer as a transducer excitation signal, and generating the engine noise with the at least one electromechanical transducer using the transducer excitation signal.

2. The method of claim 1, wherein the at least one electromechanical transducer is an actuator or a loudspeaker.

3. The method of claim 1, wherein the predetermined length of the at least one signal sample corresponds to a crank rotation angle of 720° , equivalent to two revolutions of the internal combustion engine.

4. The method of claim 1, wherein the step size is associated with an engine rotation angle step, and step sizes between consecutive signal sample support points are identical and correspond to identical engine rotation angle steps.

5. The method of claim 1, wherein step sizes between consecutive signal sample support points are fixedly defined, but different from one another.

6. The method of claim 1, wherein step sizes between consecutive signal sample support points are defined to be changeable by predeterminable functions.

7. The method of claim 1, wherein a subsequent function value of the data series of the signal sample is recalled with the computing unit based on a time-dependent value and at least one reference value.

8. The method of claim 7, wherein for an actual rotation speed adaptation of the recalled function values, the actual engine rotation speed is inputted in the computing unit as a reference value, and an actual subsequent engine rotation angle step associated with each recalled function value is determined as a subsequent rotation-speed-dependent step size in conjunction with a clock cycle as time-dependent quantity for reading out a subsequent function value stored at a signal sample support point.

9. The method of claim 1, further comprising the steps of retrievably storing in the data memory at the level value support points level curve values associated with the reference values, and adapting actual levels of read-out function values representing base level values to the reference values as signal values.

10. The method of claim 9, wherein the read-out function values are multiplied with the level curve values.

11. The method of claim 9, wherein reference values for level adaptation are selected from a rotation speed, a load, a gas pedal position of a vehicle, a speed and a vehicle size.

12. The method of claim 1, wherein multipliers are applied to the rotation-speed-dependent step sizes.

13. The method of claim 9, wherein multipliers are applied to the level curve values.

14. The method of claim 1, further comprising the step of storing in the data memory matrices enabling association of stored signal samples and level curve values associated with the reference values with each sound of an engine noise, wherein initially a separation exists between a data pool and an indexed access.

15. The method of claim 12, further comprising the step of storing in the data memory matrices enabling association of multipliers for step sizes with each sound of an engine noise, wherein initially a separation exists between a data pool and an indexed access.

16. The method of claim 13, further comprising the step of storing in the data memory matrices enabling association of multipliers for level curve values with each sound of an engine noise, wherein initially a separation exists between a data pool and an indexed access.

17. The method of claim 14, further comprising the step of adding additional matrix fields which are activated via externally addressing to generate a plurality of different sounds, wherein the different sounds can be individually selected or combined.

* * * * *